United States Patent
Dollin et al.

(10) Patent No.: US 12,174,769 B2
(45) Date of Patent: Dec. 24, 2024

(54) PERIODIC RECEIVER CLOCK DATA RECOVERY WITH DYNAMIC DATA EDGE

(71) Applicant: Advanced Micro Devices, Inc., Santa Clara, CA (US)

(72) Inventors: Gurunath Dollin, Santa Clara, CA (US); Edoardo Prete, Boxborough, MA (US); Milam Paraschou, Santa Clara, CA (US); Edward Wade Thoenes, Boxborough, MA (US); Ryan J. Hensley, Austin, TX (US); Gerald R. Talbot, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/705,048

(22) Filed: Mar. 25, 2022

(65) Prior Publication Data
US 2023/0305979 A1     Sep. 28, 2023

(51) Int. Cl.
| G06F 13/40 | (2006.01) |
| G06F 1/08 | (2006.01) |
| G06F 1/12 | (2006.01) |
| G06F 13/42 | (2006.01) |
| H03K 19/173 | (2006.01) |

(52) U.S. Cl.
CPC ............ *G06F 13/4022* (2013.01); *G06F 1/08* (2013.01); *G06F 1/12* (2013.01); *G06F 13/4068* (2013.01); *G06F 13/4282* (2013.01); *H03K 19/1737* (2013.01)

(58) Field of Classification Search
CPC .......... G06F 1/08; G06F 1/12; G06F 13/4022; G06F 13/4068; G06F 13/4282; H03K 19/1737
See application file for complete search history.

(56) References Cited

U.S. PATENT DOCUMENTS

| 6,005,872 | A | 12/1999 | Bassi et al. |
| 6,018,556 | A | 1/2000 | Janesch et al. |
| 7,609,727 | B2 | 10/2009 | Choi et al. |
| 7,770,049 | B1 | 8/2010 | Searles et al. |
| 7,772,889 | B2 | 8/2010 | Naffziger |
| 9,209,962 | B1 * | 12/2015 | Mishra ............... H04B 1/40 |

(Continued)

FOREIGN PATENT DOCUMENTS

EP     0920220 A2    6/1999

*Primary Examiner* — Eric T Oberly
(74) *Attorney, Agent, or Firm* — Kowert, Hood, Munyon, Rankin & Goetzel, P.C.; Rory D. Rankin

(57) ABSTRACT

Systems, apparatuses, and methods for implementing a periodic receiver clock data recovery scheme with dynamic data edge paths are disclosed. An IQ link calibration scheme performs a non-destructive data and edge path switch to determine an IQ offset without disturbing the data. A data path and an edge path pass through multiple stages of deserializers to widen the data path, with the deserializers clocked by clock divided versions of the original data and edge clocks. To initiate a calibration routine, the edge clock is aligned with the data clock, and then data and edge paths are swapped at a common point in a slower clock domain. The data path is then calibrated while the edge path carries the data signal. After the data path is calibrated, the edge and data paths are swapped back to the original configuration.

20 Claims, 9 Drawing Sheets

(56) References Cited

U.S. PATENT DOCUMENTS

| | | | |
|---|---|---|---|
| 9,479,150 B1* | 10/2016 | Lin | H03K 5/135 |
| 11,115,693 B2 | 9/2021 | Ryan et al. | |
| 2004/0022311 A1* | 2/2004 | Zerbe | H04B 1/1081 |
| | | | 375/229 |
| 2004/0047593 A1 | 3/2004 | Ota | |
| 2004/0196926 A1 | 10/2004 | Chien et al. | |
| 2007/0103204 A1 | 5/2007 | Egan et al. | |
| 2008/0080600 A1* | 4/2008 | Dai | H03M 9/00 |
| | | | 375/220 |
| 2009/0129505 A1* | 5/2009 | Ware | G06F 13/4243 |
| | | | 375/316 |
| 2010/0021003 A1 | 1/2010 | Baum et al. | |
| 2010/0071010 A1 | 3/2010 | Elnathan et al. | |
| 2010/0135378 A1* | 6/2010 | Lin | H04L 7/0058 |
| | | | 375/232 |
| 2013/0343401 A1* | 12/2013 | Dickson | G06F 13/4072 |
| | | | 370/419 |
| 2019/0207740 A1* | 7/2019 | Graumann | H04L 1/0045 |

* cited by examiner

PERIODIC RECEIVER CLOCK DATA RECOVERY WITH DYNAMIC DATA EDGE

BACKGROUND

Description of the Related Art

Modern semiconductor chips include a variety of circuits and components to facilitate fast and efficient computation. When transferring information between functional blocks in a semiconductor chip, electrical signals are typically sent on metal traces. Transmitters in a first functional block send the electrical signals across the metal traces. Receivers in a second functional block receive the electrical signals. In some cases, the two functional blocks are within a same die. In other cases, the two functional blocks are on separate dies. The processing speed of information processing systems and devices continues to increase as new systems and devices are developed.

When data signals are sent between functional blocks, the sampling time in the middle of the data eye can drift from the ideal alignment. Realigning the sampling point typically involves interrupting the data stream.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, and methods for implementing a periodic receiver clock data recovery scheme with dynamic data edge paths are disclosed herein. In one implementation, an in-phase and quadrature (IQ) link calibration scheme involves performing a non-destructive data and edge path switch to determine an IQ offset without disturbing the data. A data path and an edge path pass through multiple stages of deserializers to widen their respective data bus widths, with the deserializers clocked by clock divided versions of the original data and edge clocks. To initiate a calibration routine, the edge clock is aligned with the data clock, and then the data and edge paths are swapped at a common point in a slower clock domain. The data path is then calibrated while the edge path carries the data signal. After the data path is calibrated, the edge and data paths are reswapped back to the original configuration.

Figure 1:
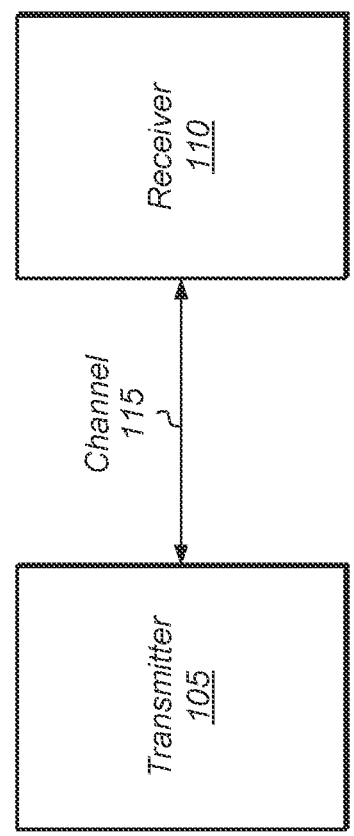
FIG. 1 is a block diagram of one implementation of a generic computer or communication system including a transmitter and a receiver.

Referring now to FIG. 1, a block diagram of one implementation of a generic computer or communication system 100 including a transmitter 105 and a receiver 110 is shown. In one implementation, transmitter 105 transmits data to receiver 110 over communication channel 115. Communication channel 115 can include any number of individual connections (i.e., signal paths) between transmitter 105 and receiver 110, with the number of connections varying according to the implementation. Also, the individual connections of communication channel 115 can support differential and/or single-ended signals. In one implementation, differential signals include two signals that are out of phase and equal in amplitude. A single-ended signal is one signal carrying data that transitions between two voltage levels, such as between ground (i.e., 0 Volts) and a supply voltage (i.e., VDD). Depending on the implementation, communication channel 115 is a cable, backplane, one or more metal traces, or other type of communication channel. For example, in one implementation, channel 115 is one or more metal traces between two chips of a multi-chip module. At the physical layer, the communication between the transmitter 105 and the receiver device 110 can be unidirectional or bidirectional according to a given transmission protocol. It is noted that system 100 can include any number and type of other devices. Additionally, system 100 can include any number of transmitter-receiver pairs dispersed throughout the system.

Transmitter 105 and receiver 110 can be any type of devices depending on the implementation. For example, in one implementation, transmitter 105 is a processing unit (e.g., central processing unit (CPU), graphics processing unit (GPU)) and receiver 110 is a memory device. The memory device can be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAIVIBUS DRAM (RDRAM), static RAM (SRAM), etc. One or more memory devices can be coupled onto a circuit board to form memory modules such as single inline memory modules (SIMMs), dual inline memory modules (DIMMs), etc. Alternatively, the memory devices can be mounted within a system on chip (SoC) or integrated circuit (IC) in a chip-on-chip configuration, a package-on-package configuration, or a multi-chip module (MCM) configuration.

In another implementation, transmitter 105 is an input/output (I/O) fabric and receiver 110 is a peripheral device.

The peripheral device can be a device supporting various types of wireless communication, such as wifi, Bluetooth, cellular, global positioning system, etc. The peripheral device can also include additional storage, including RAM storage, solid state storage, or disk storage. The peripheral device can be a user interface device such as a display screen, including touch display screens or multitouch display screens, keyboard or other input devices, microphones, speakers, etc. In other implementations, transmitter 105 and receiver 110 are other types of devices. It is noted that system 100 can be any type of system, such as an IC, SoC, MCM, and so on.

Figure 2:
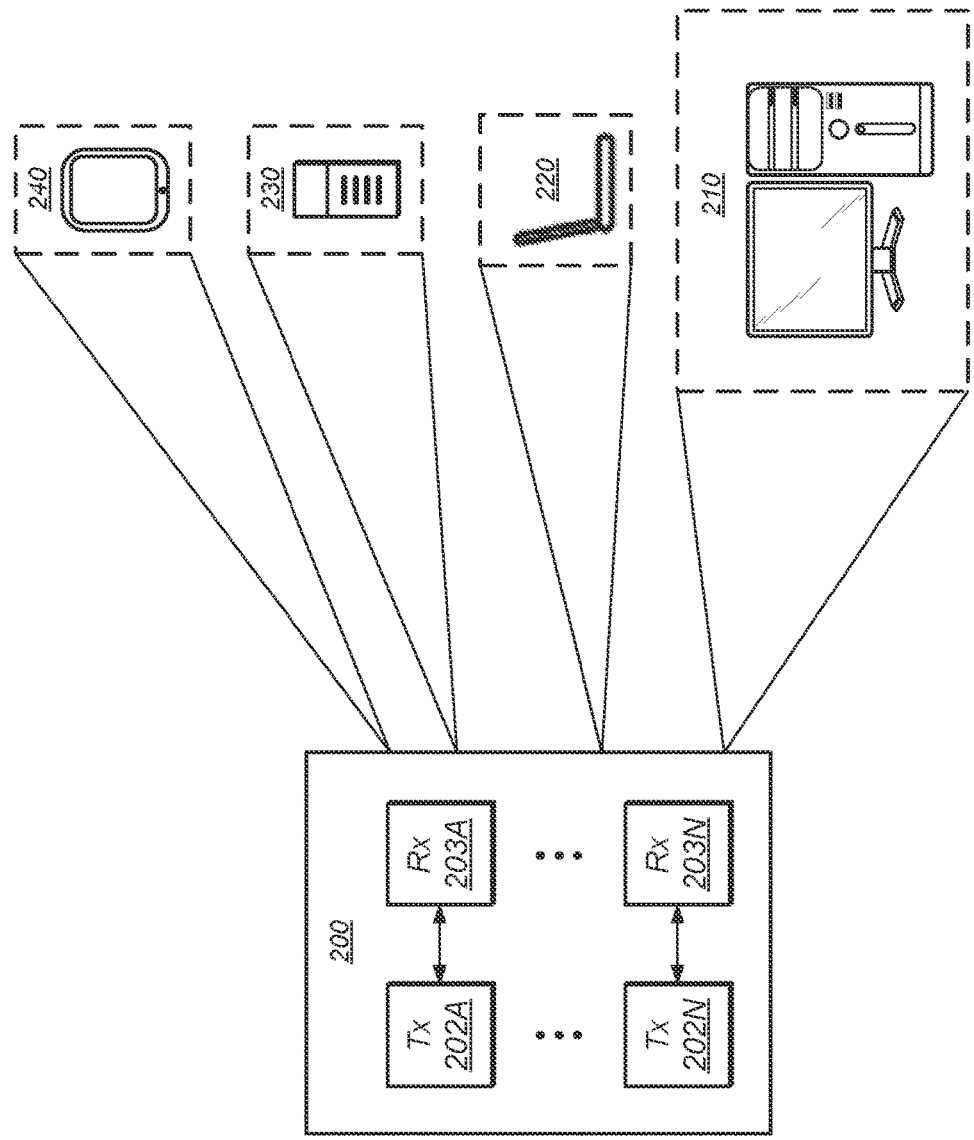
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other systems, apparatuses, and devices (e.g., game consoles, wearable devices, Internet of things (IoT) devices) are possible and are contemplated. In the illustrated implementation, the system 200 includes any number of pairs of transmitters 202A-N and receivers 203A-N.

Figure 3:
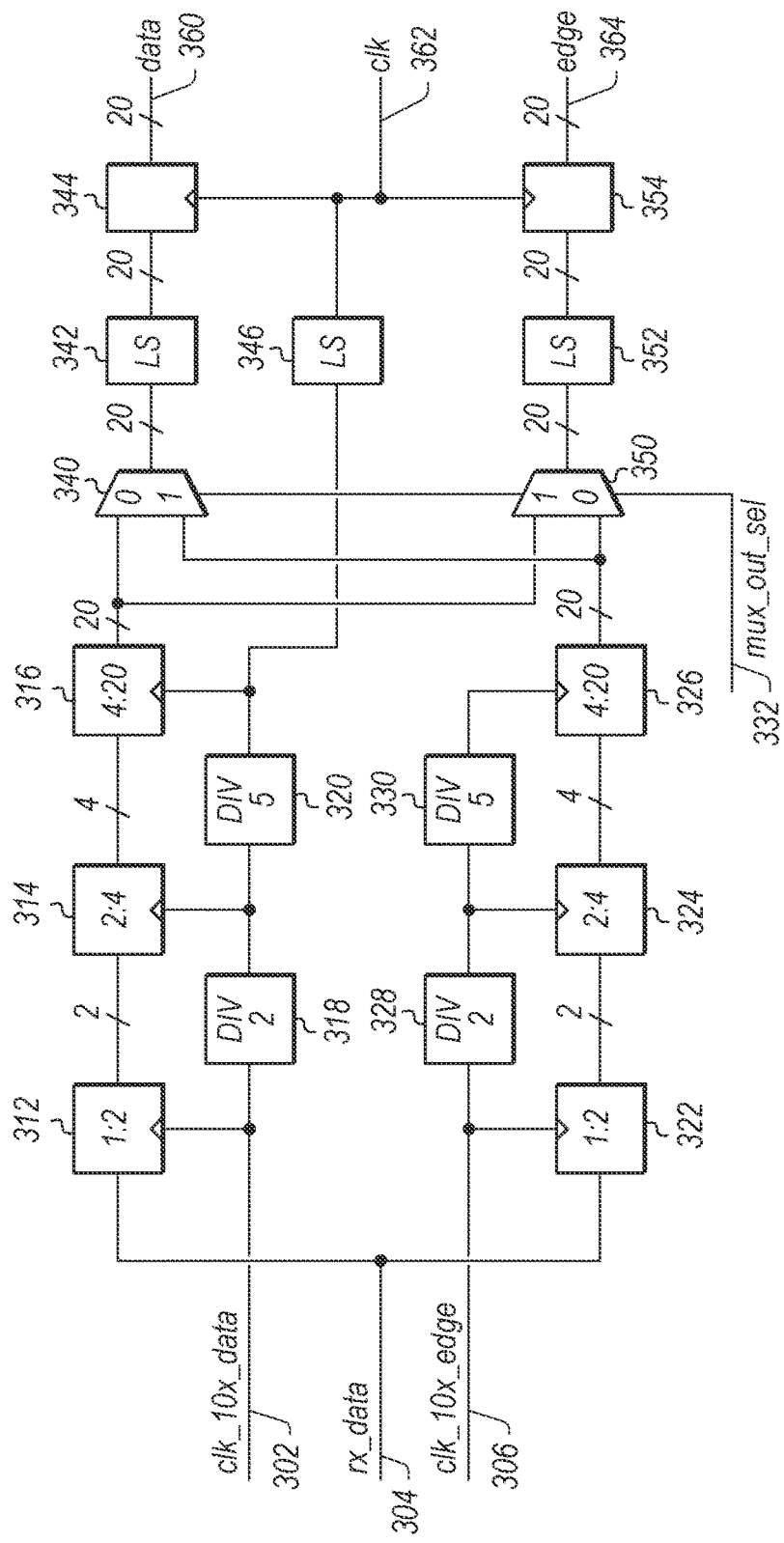
FIG. 3 is a block diagram of one implementation of a receiver.

Referring now to FIG. 3, a block diagram of one implementation of a receiver 300 is shown. In one implementation, receiver 110 (of FIG. 1) includes one or more instances of the components of receiver 300. In one implementation, receiver 300 receives a locally-generated data clock 302, a data signal 304, and a locally generated edge clock 306. Locally-generated data clock 302 and locally-generated edge clock 306 are generated by the receiver. In one implementation, locally-generated data clock 302 and locally-generated edge clock 306 are generated by phase-locked loops (PLLs) which are not shown to avoid obscuring the figure. Data clock 302 is used to clock the data signal 304 along the data path while edge clock 306 is used to clock the data signal 304 along the edge path. The position of data clock 302 is intended to be in the middle of the data eye to provide accurate sampling of the data embedded in data signal 304. The position of edge clock 306 is intended to be at the edge of the data eye to assist receiver 300 in maintaining proper alignment of sampling points used to sample the data embedded in data signal 304.

The top path shown in receiver 300 is the data path while the lower path shown in receiver 300 is the edge path. From time to time, the data path needs to be recalibrated to detect if the data eye has drifted. In one implementation, to perform the calibration of the data path, the edge clock 306 is aligned with the data clock 302, and then the data path and edge path are swapped. Based on the construction of the illustrated components, receiver 300 is able to perform the switch between data and edge paths without interrupting the collection of the data. Prior to the switch occurring, the data path is sampling the data in the middle of the eye while the edge path is roughly 90 degrees out of phase with its sampling, with respect to the data path, to measure the width of the data eye.

The data signal 304 is coupled to serial-to-parallel flops 312 and 322. The data clock 302 clocks flops 312 and the edge clock 306 clocks flops 322. Flops 312 and 322 convert the serial data into parallel data with a width of 2. Also, divide-by-2 units 318 and 328 divide the data clock 302 and edge clock 306, respectively by two. The resultant divided clocks are provided to flops 314 and 324 which widen the parallel data from a width of two bits to a width of four bits. The clocks are divided further by divide-by-5 units 320 and 330 to clock flops 316 and 326, respectively. The outputs of flops 316 and 326 have a data bus width of 20 bits. These data buses are coupled to multiplexers (or muxes) 340 and 350. The mux output select signal 332 is coupled to muxes 340 and 350 to allow the data and edge paths to be swapped. The outputs of muxes 340 and 350 are coupled to level shifters 342 and 352, respectively, and then to flops 344 and 354, respectively. The divide-by-10 clock is passed through level shifter 346 and then coupled to flops 344 and 354. The clock 362 is also output to subsequent circuit(s) along with the data signal 360 and edge signal 364, with both data signal 360 and edge signal 364 having a 20-bit width.

It is noted that the ratios used in receiver 300 for dividing down the clock and widening the width of the parallel data bus are merely representative of one particular implementation. In other implementations, other ratios may be used to divide down the clock and widen the parallel data bus in other step sizes to achieve the same final bus width and clock frequency or other bus widths and other clock frequencies.

Figure 4:
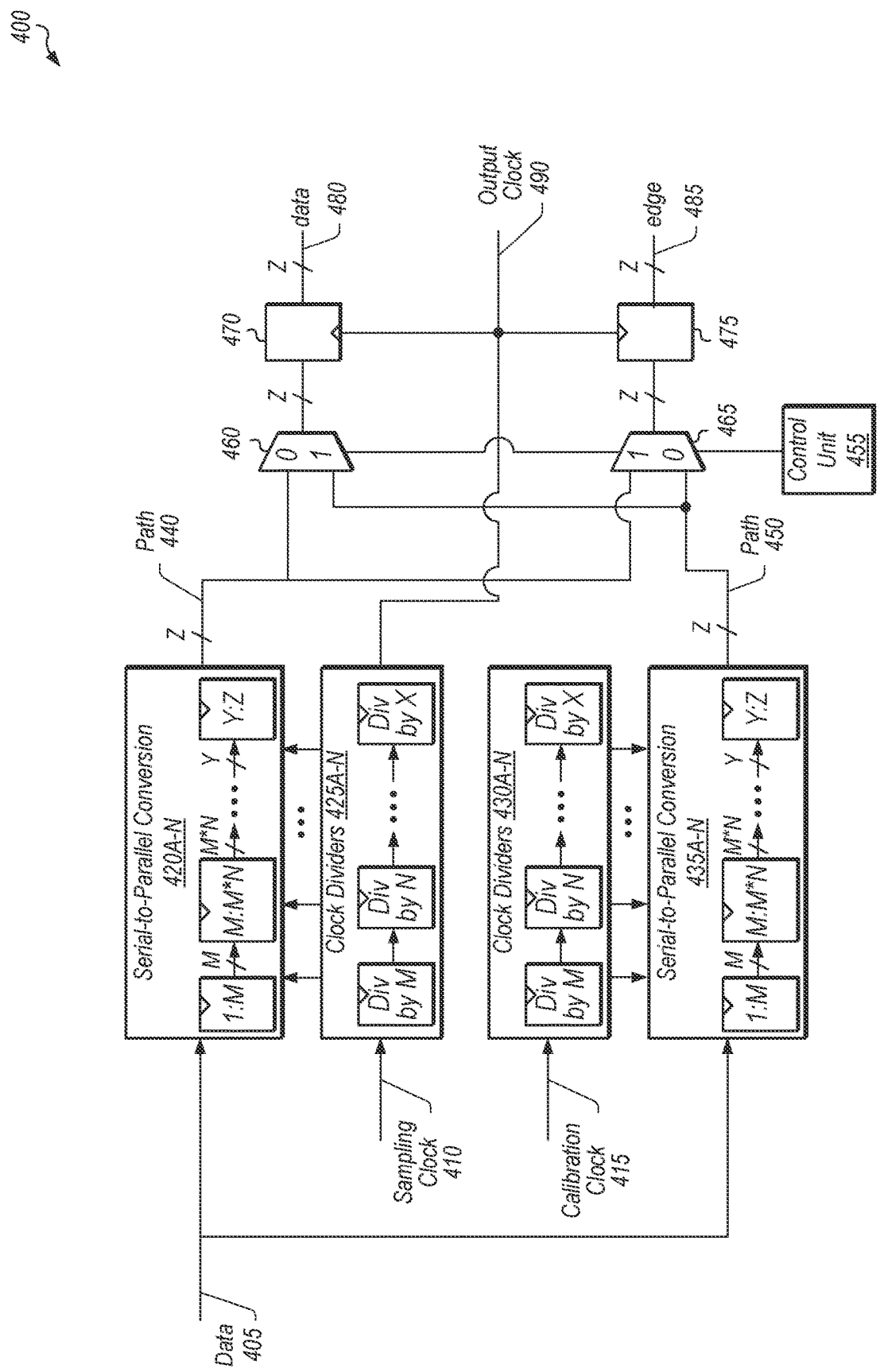
FIG. 4 is a block diagram of another implementation of a receiver.

Turning now to FIG. 4, a block diagram of another implementation of a receiver 400 is shown. Receiver 400 includes a similar structure as receiver 300 (of FIG. 3) but with a more general layout of components that can be adapted to more scenarios. Receiver 400 receives data 405, sampling clock 410, and calibration clock 415, with data 405 coupled to serial-to-parallel conversion circuitry 420A-N and serial-to-parallel conversion circuitry 435A-N, sampling clock 410 coupled to clock dividers 425A-N, and calibration clock 415 coupled to clock dividers 430A-N. Serial-to-parallel conversion circuitry 420A-N and serial-to-parallel conversion circuitry 435A-N can also be referred to as deserializers or deserializer circuits. Also, sampling clock 410 can be referred to as data clock 410, and calibration clock 415 can be referred to as edge clock 415.

Serial-to-parallel conversion circuitry 420A-N includes any number of stages for converting the serial path of data 405 into a parallel path 440 of Z bits, with Z being a positive integer. The Z-bit width of the parallel path 440 output of serial-to-parallel conversion circuitry 420A-N can vary according to the implementation. Also, the number of stages that are used to convert the serial input into Z-bits can vary from implementation to implementation. Clock dividers 425A-N divide the sampling clock 410 down to lower frequencies to be used by the stages of serial-to-parallel conversion circuitry 420A-N. The factors for dividing down sampling clock 410 can be based on how much the different stages of serial-to-parallel conversion circuitry 420A-N are expanding the width of the data bus. Similarly, serial-to-parallel conversion circuitry 435A-N includes any number of stages for converting the serial path of data 405 into a parallel path 450 of Z bits, and clock dividers 430A-N divide down calibration clock 415 for triggering the different stages of serial-to-parallel conversion circuitry 435A-N.

Data path 440 and edge path 450 are both coupled to the two-input muxes 460 and 465. Control unit 455 generates the select signal for both muxes 460 and 465 to swap data path 440 and edge path 450 for training purposes. The Z-bit outputs of muxes 460 and 465 are coupled to flops 470 and 475, respectively. The outputs of flops 470 and 475 are the data 480 and edge 485 outputs, respectively. However, these data 480 and edge 485 outputs are swapped by control unit 455 when performing training and/or calibration. The output clock 490 is also provided to subsequent circuit(s), with output clock 490 generated by clock dividers 425A-N.

Figure 5:
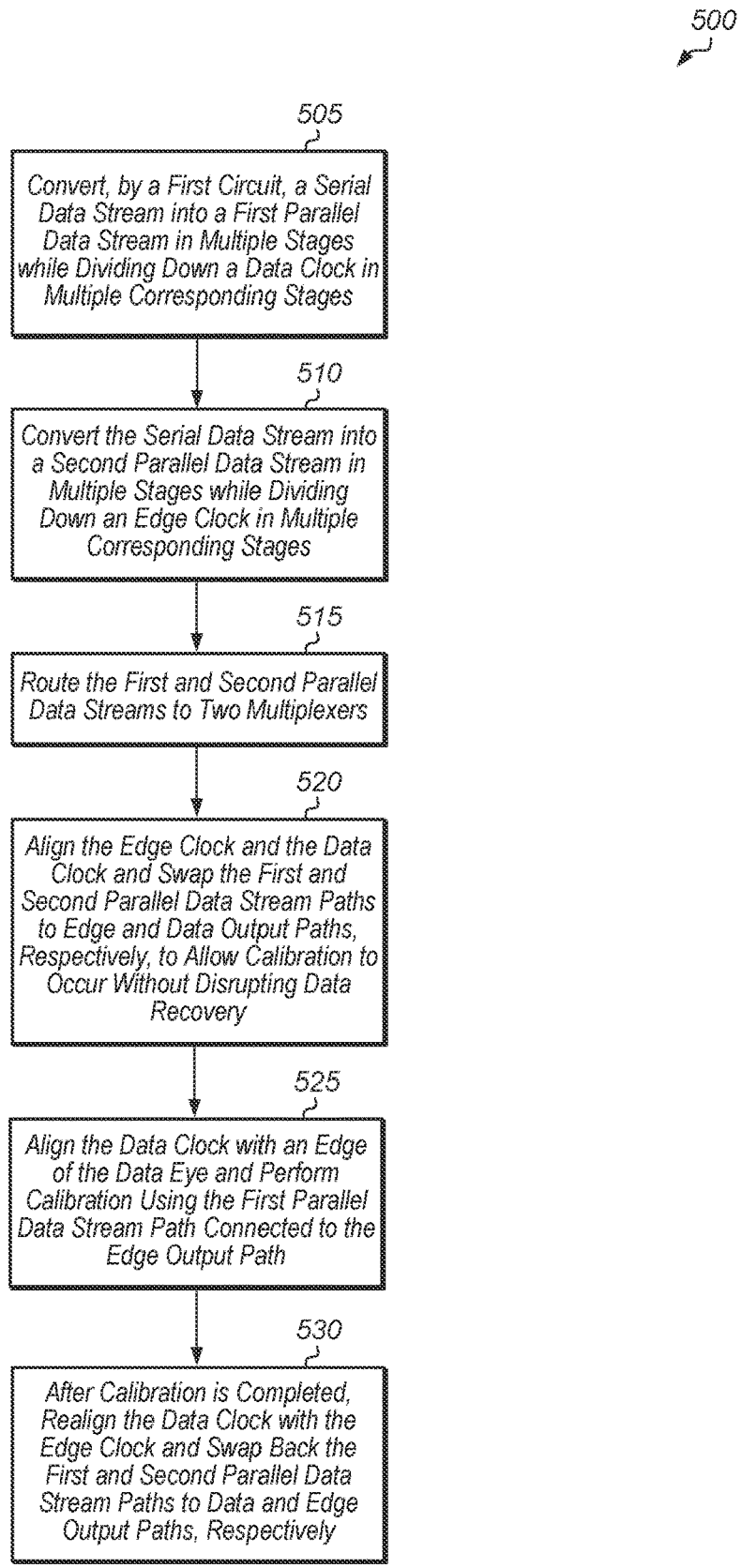
FIG. 5 is a generalized flow diagram illustrating one implementation of a method for performing a non-destructive calibration scheme.
Figure 6:
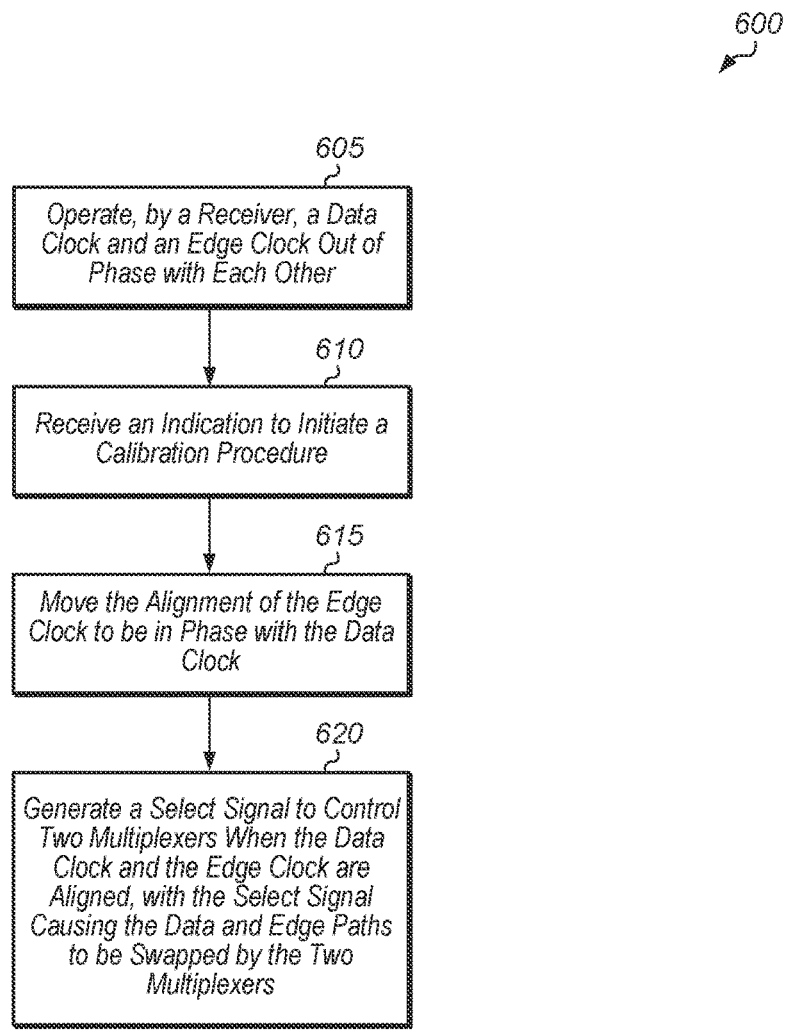
FIG. 6 is a generalized flow diagram illustrating one implementation of a method for choosing the appropriate time for generating a multiplexer select signal.
Figure 7:
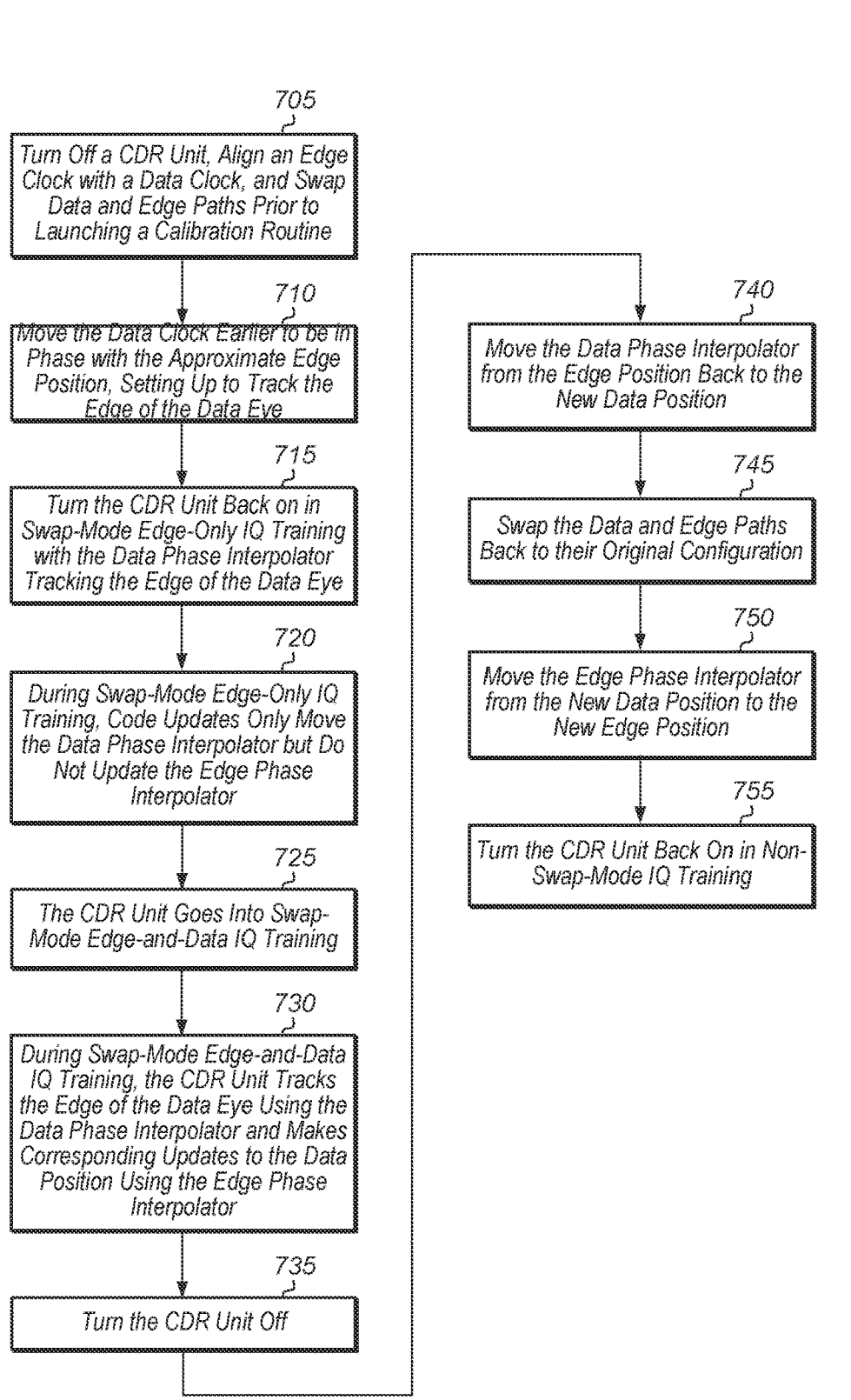
FIG. 7 is a generalized flow diagram illustrating one implementation of a method for performing a data and edge path swap as part of a non-destructive calibration scheme.

Referring now to FIG. 5, one implementation of a method 500 for performing a non-destructive calibration scheme is shown. For purposes of discussion, the steps in this implementation and those of FIG. 6-7 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 500 (and methods 600-700).

A receiver converts a serial data stream into a first parallel data stream in multiple stages while dividing down a data clock in multiple corresponding stages (block 505). Also, the receiver converts the serial data stream into a second parallel data stream in multiple stages while dividing down an edge clock in multiple corresponding stages (block 510). It is noted that the edge clock is out of phase with respect to the data clock to allow the second parallel data stream to be used for capturing edge information associated with the data eye of the serial data stream. The first and second parallel data streams are routed to two multiplexers (block 515). The receiver aligns the edge clock with the data clock and swaps the first and second parallel data stream paths to edge and data output paths, respectively, to allow calibration to occur without disrupting data recovery (block 520). It is noted that the swapping to the edge path allows for the movement of the data clock (for calibration) without disturbing the data recovery. Next, the data clock is aligned with an edge of the data eye and calibration of the edge of the data eye is performed using the first parallel data stream connected to the edge output path (block 525). After calibration is completed, the receiver re-aligns the data clock with the edge clock and swaps back (i.e., re-swaps) the first and second parallel data stream paths to data and edge output paths, respectively (block 530). In other words, when the calibration routine is finished, the data stream paths revert back to their original configuration. After block 530, method 500 ends.

Turning now to FIG. 6, one implementation of a method 600 for choosing the appropriate time for generating a multiplexer select signal is shown. A receiver circuit operates a data clock (i.e., sampling clock) and an edge clock (i.e., calibration clock) out of phase with each other (block 605). In one implementation, the data clock and the edge clock are approximately 90 degrees out of phase with each other. At a given point in time, the receiver receives an indication to initiate a calibration procedure (block 610). In response to receiving the indication, the receiver moves the alignment of the edge clock to be in phase with the data clock (block 615). Next, the receiver generates a select signal to control two multiplexers when the data clock and the edge clock are aligned, with the select signal causing the data and edge paths to be swapped by the two multiplexers (block 620). After block 620, method 600 ends.

Referring now to FIG. 7, one implementation of a method 700 for performing a data and edge path swap as part of a non-destructive calibration scheme is shown. A clock data recovery (CDR) unit is turned off, an edge clock is aligned with a data clock, and data and edge paths are swapped prior to launching a calibration routine (block 705). The result of the swap is the edge sampler being used for functional data and the data sampler being used for edge information. Next, the data clock is moved earlier to be in phase with the approximate edge position, setting up to track the edge of the data eye (block 710). The term "data eye" refers to the data pattern as seen on an oscilloscope when a digital signal from a receiver is repeatedly sampled. The center of the data eye is the point in the middle of the transitions between high and low voltages for a signal with two levels. The edge of the data eye refers to the transition point when a transition would occur from low to high voltage or high to low voltage when the data embedded in the digital signal changes values.

Then, the CDR unit is turned back on in swap-mode edge-only IQ training with the data phase interpolator tracking the edge of the data eye (block 715). During swap-mode edge-only IQ training, code updates only move the data phase interpolator but do not update the edge phase interpolator (block 720). Next, the CDR unit goes into swap-mode edge-and-data IQ training (block 725). During swap-mode edge-and-data IQ training, the CDR unit tracks the edge of the data eye using the data phase interpolator and makes corresponding updates to the data position using the edge phase interpolator (block 730).

Next, the CDR unit is turned off (block 735). Then, the data phase interpolator is moved from the edge position back to the new data position (block 740). The new data position refers to the updated data position based on the newly discovered IQ offset value. Next, the data and edge paths are swapped back to their original configuration (block 745). Then, the edge phase interpolator is moved from the new data position to the new edge position (block 750). Next, the CDR unit is turned back on in non-swap-mode IQ training (block 755). After block 755, method 700 ends.

Figure 8:
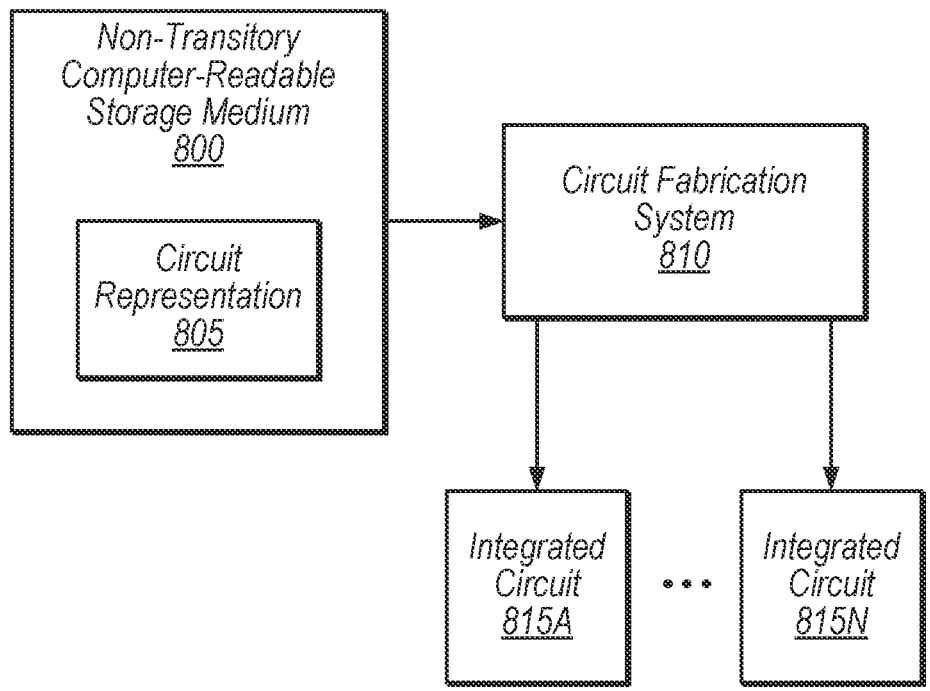
FIG. 8 is a block diagram illustrating one implementation of a non-transitory computer-readable storage medium that stores a circuit representation.

Turning now to FIG. 8, a block diagram illustrating one implementation of a non-transitory computer-readable storage medium 800 that stores a circuit representation 805 is shown. In one implementation, circuit fabrication system 810 processes the circuit representation 805 stored on non-transitory computer-readable storage medium 800 and fabricates any number of integrated circuits 815A-N based on the circuit representation 805.

Non-transitory computer-readable storage medium 800 can include any of various appropriate types of memory devices or storage devices. Medium 800 can be an installation medium (e.g., a thumb drive, CD-ROM), a computer system memory or random access memory (e.g., DRAM, DDR RAM, SRAM, EDO RAM, Rambus RAM), a non-volatile memory (e.g., a Flash, magnetic media, a hard drive, optical storage), registers, or other types of memory elements. Medium 800 can include other types of non-transitory memory as well or any combinations thereof. Medium 800 can include two or more memory mediums which reside in different locations (e.g., in different computer systems that are connected over a network).

In various implementations, circuit representation 805 is specified using any of various appropriate computer languages, including hardware description languages such as, without limitation: VHDL, Verilog, SystemC, SystemVerilog, RHDL, etc. Circuit representation 805 is usable by circuit fabrication system 810 to fabricate at least a portion of one or more of integrated circuits 815A-N. The format of circuit representation 805 is recognizable by at least one circuit fabrication system 810. In some implementations, circuit representation 805 includes one or more cell libraries which specify the synthesis and/or layout of the integrated circuits 815A-N.

Circuit fabrication system 810 includes any of various appropriate elements configured to fabricate integrated circuits. This can include, for example, elements for depositing semiconductor materials (e.g., on a wafer, which can include masking), removing materials, altering the shape of deposited materials, modifying materials (e.g., by doping materials or modifying dielectric constants using ultraviolet processing), etc. Circuit fabrication system 810 can also perform testing of fabricated circuits for correct operation.

In various implementations, integrated circuits 815A-N operate according to a circuit design specified by circuit representation 805, which can include performing any of the functionality described herein. For example, integrated circuits 815A-N can include any of various elements shown in the circuits illustrated herein and/or multiple instances of the circuit illustrated herein. Furthermore, integrated circuits 815A-N can perform various functions described herein in conjunction with other components. For example, integrated circuits 815A-N can be coupled to voltage supply circuitry that is configured to provide a supply voltage (e.g., as opposed to including a voltage supply itself). Further, the functionality described herein can be performed by multiple connected integrated circuits.

As used herein, a phrase of the form "circuit representation that specifies a design of a circuit . . . " does not imply that the circuit in question must be fabricated in order for the element to be met. Rather, this phrase indicates that the circuit representation describes a circuit that, upon being fabricated, will be configured to perform the indicated actions or will include the specified components.

Figure 9:
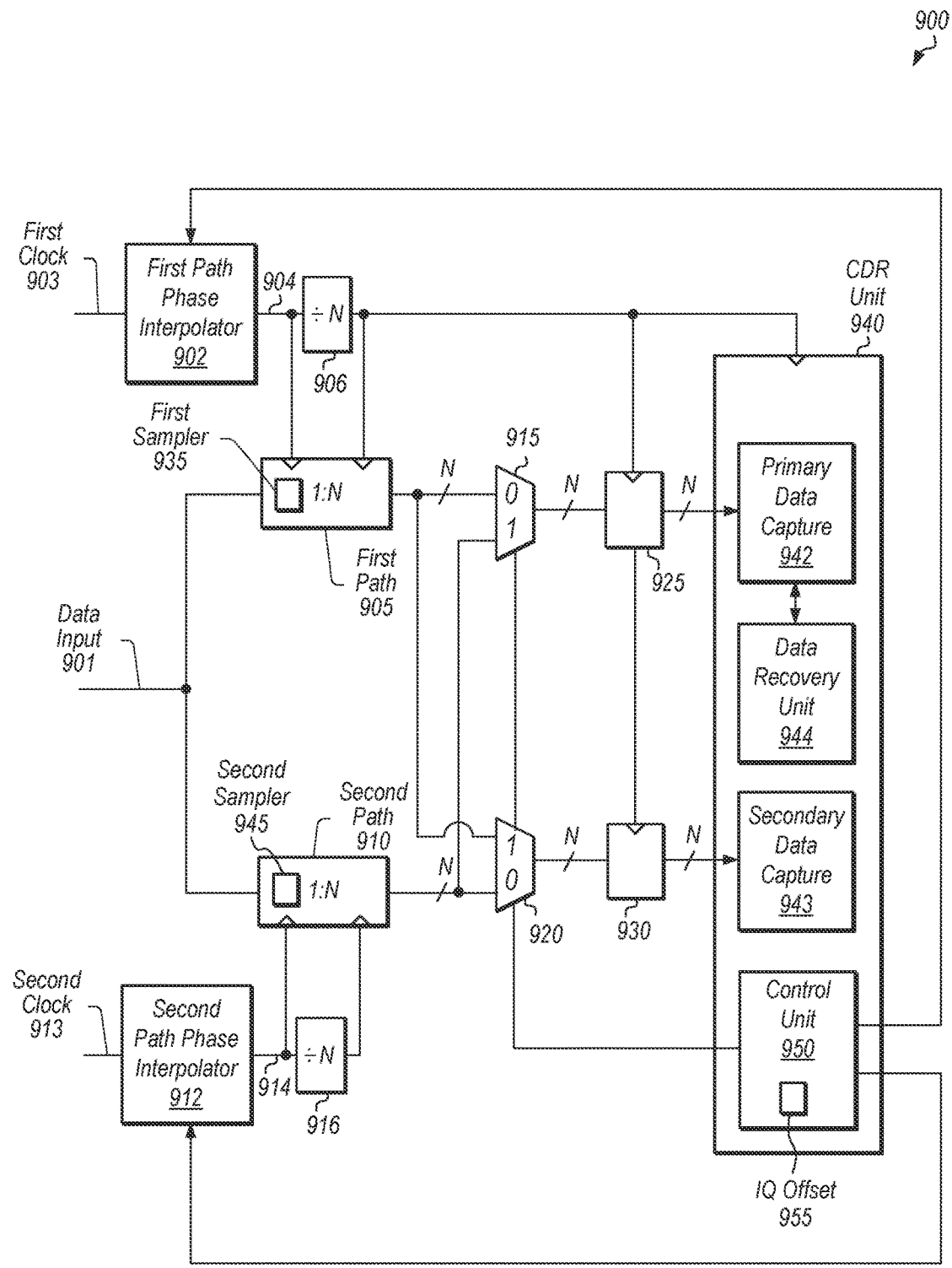
FIG. 9 is a block diagram of one implementation of a non-destructive IQ offset calibration apparatus.

Referring now to FIG. 9, a block diagram of one implementation of a non-destructive IQ offset calibration apparatus 900 is shown. As shown in FIG. 9, the outputs of first path 905 and second path 910 are coupled to multiplexers 915 and 920. The circuitry of first path 905 is clocked by the outputs of first path phase interpolator 902 and clock divider(s) 906, and the circuitry of second path 910 is clocked by the outputs of second path phase interpolator 912 and clock divider(s) 916. The inputs to first path phase interpolator 902 and second path phase interpolator 912 are first clock 903 and second clock 913, respectively. It is noted that first clock 903 can also be referred to as data clock 903 and second clock 913 can also be referred to as edge clock 913. It is noted that first clock 903 and second clock 913 are locally generated in at least one implementation. Also, first path 905 can be referred to as data path 905 and second path 910 can be referred to as edge path 910. The phase of first clock 903 is adjusted by first path phase interpolator 902 to create phase-adjusted first clock 904 and the phase of second clock 913 is adjusted by second path phase interpolator 912 to create phase-adjusted second clock 914. Control unit 950 sends control signals and commands to first path phase interpolator 902 and second path phase interpolator 912 during operation to control the phases of phase-adjusted first clock 904 and phase-adjusted second clock 914, respectively. During normal operation, the phase-adjusted first clock 904 and the phase-adjusted second clock 914 are out of phase with respect to each other. In one implementation, phase-adjusted first clock 904 and phase-adjusted second clock 914 are approximately 90 degrees out of phase with each other. This allows the first path 905, clocked by phase-adjusted clock 904 and clock-divided versions of phase-adjusted first clock 904, to sample in the middle of the data eye while the second path 910, clocked by phase-adjusted clock 914 and clock-divided versions of phase-adjusted second clock 914, samples at the edge of the data eye.

It is assumed for the purposes of this discussion that the same data input 901 is being processed by the circuitry of first path 905 and the circuitry of second path 910. First path 905 and second path 910 both have an N-bit width output data path, where N is a positive integer. The value of N can vary from implementation to implementation. In one implementation, first path 905 and second path 910 perform a serial-to-parallel conversion of the data traversing their paths. In this implementation, the input data path width is less than the output data path width. The output data paths of first path 905 and second path 910 are coupled to multiplexers 915 and 920, respectively. The multiplexers 915 and 920 allow the data streams output by first path 905 and second path 910 to be swapped going into primary data capture unit 942 and secondary data capture unit 943. Clock data recovery (CDR) unit 940 and control unit 950 monitor the relationship between the two signal paths feeding into primary data capture unit 942 and secondary data capture unit 943. Control unit 950 adjusts the phases of first and second path phase interpolators 902 and 912, generates the select signal for muxes 915 and 920, and determines the phase difference between phase-adjusted first clock 904 and phase-adjusted second clock 914. This phase difference is stored by control unit 950 and can be referred to as IQ offset 955. IQ offset 955 is determined during both non-swap-mode training and swap-mode training. It is noted that CDR unit 940 and control unit 950 can be implemented using any suitable combination of circuitry and/or processing elements executing program instructions. It is also noted that CDR unit 940 and control unit 950 may be referred to as CDR circuit 940 and control circuit 950, respectively.

In one implementation, prior to performing a calibration routine, first path 905 is feeding data through mux 915 and flops 925 to primary data capture unit 942. Prior to the calibration routine, second path 910 is feeding edge information through mux 920 and flops 930 to secondary data capture unit 943. Prior to performing the calibration routine, first sampler 935 and second sampler 945 are approximately 90 degrees out of phase with respect to each other. In one implementation, when a calibration routine is being initiated, the secondary data capture 943 needed for continuous clock and data recovery by CDR unit 940 is ignored, thus pausing the CDR process, and the phase of the phase-adjusted second clock 914 used for second path 910 is walked to align with the position of the phase-adjusted first clock 904 used for first path 905. Then, once the phase-adjusted first clock 904 and phase-adjusted second clock 914 are aligned in phase, first path 905 and second path 910 are swapped through muxes 915 and 920 so that the signals on first path 905 pass through flops 930 into secondary data capture unit 943 and the signals on second path 910 pass through flops 925 into primary data capture unit 942. The swap is performed so that data recovery unit 944 can continue to operate without losing any data. After the swap, the phase of the phase-adjusted first clock 904 used for first path 905 is walked to match approximately with the previous phase of the phase-adjusted second clock 914 prior to the phase-adjusted second clock 914 being walked into alignment with the phase-adjusted first clock 904. In other words, the phase of the phase-adjusted first clock 904 is walked to match with the pre-swap phase of the phase-adjusted second clock 914. In one implementation, the previous phase of phase-adjusted second clock 914 with respect to phase-adjusted first clock 904 is indicated by IQ offset 955.

Next, secondary data capture 943 is re-enabled for IQ training mode. During a first portion of IQ training mode, CDR unit 940 tracks the edge of the data input 901 signal traversing first path 905 to secondary data capture 943 and updates, based on this tracking, only first path phase interpolator 902 without updating second path phase interpolator 912. Eventually, the tracking by CDR unit 940 causes first path phase interpolator 902 to stabilize to the actual edge position of the data eye. During the first portion of IQ training mode, spread spectrum drift is occurring but is not being tracked by CDR unit 940. In order to overcome this drift, CDR unit 940 initiates a second portion of IQ training mode. During the second portion of IQ training, CDR unit 940 is tracking the edge with first path 905 and updating the data position along with the edge position. During the second portion of IQ training, primary data capture unit 942 is capturing the output of second path 910 while secondary data capture unit 943 is capturing the output of first path 905. The second portion of IQ training is performed to provide an in-between point to catch up with the spread spectrum drift before the phase interpolators 902 and 912 swap back to their original configuration.

Next, after the second portion of IQ training, a swap-back stage is performed. At the start of the swap-back stage, secondary data capture 943 is ignored. Then, first path phase interpolator 902 output clock 904 is walked into alignment with second path phase interpolator 912 output clock 914, which makes the signals at the input of muxes 915 and 920 equal. Next, control unit 950 switches muxes 915 and 920 back to the original setting so that the output of first path 905 is routed to flops 925 and the output of second path 910 is routed to flops 930. Then, second path phase interpolator 912 is walked approximately 90 degrees earlier to the edge position and CDR unit 940 is re-enabled. The result of IQ training is a change in the phase setting difference between first path phase interpolator 902 and second path phase interpolator 912. This change in the phase setting difference is equal to the discovered IQ offset value 955. It is noted that the arrangement of components in non-destructive IQ offset calibration apparatus 900 is merely indicative of one particular implementation. In other implementations, non-destructive IQ offset calibration apparatus 900 can include other components and/or non-destructive IQ offset calibration apparatus 900 can be arranged in other suitable manners.

It should be emphasized that the above-described implementations are only non-limiting examples of implementations. The implementations are applied for up-scaled, down-scaled, and non-scaled images. Numerous variations and modifications will become apparent to those skilled in the art once the above disclosure is fully appreciated. It is intended that the following claims be interpreted to embrace all such variations and modifications.

What is claimed is:

1. An apparatus comprising:
   a first serial-to-parallel conversion circuit and a second serial-to-parallel conversion circuit; and
   a control circuit configured to:
   responsive to a calibration routine being initiated, cause the first serial-to-parallel conversion circuit to output data using a first data path and the second serial-to-parallel conversion circuit to output data using a second data path different from the first data path; and
   responsive to the calibration routine being completed, cause the first serial-to-parallel conversion circuit to output data using the second data path and the second serial-to-parallel conversion circuit to output data using the first data path.

2. The apparatus as recited in claim 1, wherein to initiate the calibration routine, the control circuit is configured to:
   disable a clock data recovery circuit; and
   adjust an edge clock to a later position within a data eye.

3. The apparatus as recited in claim 2, wherein the control circuit is further configured to adjust a data clock earlier to an approximate edge position setting up to track an edge of the data eye responsive to initiating the calibration routine.

4. The apparatus as recited in claim 1, wherein during the calibration routine, the control circuit is further configured to only update a data phase interpolator but not update an edge phase interpolator.

5. The apparatus as recited in claim 4, wherein the control circuit is configured to cause the first serial-to-parallel conversion circuit to output data using the first data path and the second serial-to-parallel conversion circuit to output data using the second data path without interrupting data capture.

6. The apparatus as recited in claim 1, wherein the control circuit is further configured to cause a secondary data capture unit to capture information from the first serial-to-parallel conversion circuit and a primary data capture unit to capture information from the second serial-to-parallel conversion circuit.

7. The apparatus as recited in claim 1, further comprising first and second multiplexers, wherein the control circuit is further configured to generate select signals for the first and second multiplexers to cause the first serial-to-parallel conversion circuit to output data using the first data path and the second serial-to-parallel conversion circuit to output data using the second data path, when an edge clock is aligned with a data clock.

8. A method comprising:
   converting, by a first serial-to-parallel conversion circuit and a second serial-to-parallel conversion circuit, an input serial data stream into a pair of parallel data streams over multiple stages;
   driving, by a pair of clock divider circuits, the first serial-to-parallel conversion circuit and the second serial-to-parallel conversion circuit;
   responsive to a calibration routine being initiated, causing, by control circuitry, the first serial-to-parallel conversion circuit to output data using a first data path and the second serial-to-parallel conversion circuit to output data using a second data path different from the first data path; and
   responsive to the calibration routine being completed, causing, by the control circuitry, the first serial-to-parallel conversion circuit to output data using the second data path and the second serial-to-parallel conversion circuit to output data using the first data path.

9. The method as recited in claim 8, wherein prior to initiating the calibration routine, the method further comprises:
   disabling a clock data recovery circuit; and
   adjusting an edge clock to a later position within a data eye.

10. The method as recited in claim 9, further comprising adjusting a data clock earlier to an approximate edge position setting up to track an edge of the data eye responsive to initiating the calibration routine.

11. The method as recited in claim 8, further comprising only updating only a data phase interpolator without updating an edge phase interpolator during the calibration routine.

12. The method as recited in claim 11, wherein the method comprises causing, by the control circuitry, the first serial-to-parallel conversion circuit to output data using the first data path and the second serial-to-parallel conversion circuit to output data using the second data path without interrupting data capture.

13. The method as recited in claim 8, further comprising causing, by the control circuitry, a secondary data capture unit to capture information from the first serial-to-parallel conversion circuit and a primary data capture unit to capture information from the second serial-to-parallel conversion circuit.

14. The method as recited in claim 8, further comprising generating select signals for first and second multiplexers to cause the first serial-to-parallel conversion circuit to output data using the first data path and the second serial-to-parallel conversion circuit to output data using the second data path, when an edge clock is aligned with a data clock.

15. A system comprising:
   an interface configured to receive an input serial data stream; and
   a control circuit configured to:
      responsive to a calibration routine being initiated, cause a first serial-to-parallel conversion circuit to output data using a first data path and a second serial-to-parallel conversion circuit to output data using a second data path different from the first data path, wherein the first serial-to-parallel conversion circuit and the second serial-to-parallel conversion circuit both receive the input serial data stream; and
      responsive to the calibration routine being completed, cause the first serial-to-parallel conversion circuit to output data using the second data path and the second serial-to-parallel conversion circuit to output data using the first data path.

16. The system as recited in claim 15, wherein to initiate the calibration routine, the control circuit is further configured to:
   disable a clock data recovery circuit; and
   adjust an edge clock to a later position within a data eye.

17. The system as recited in claim 16, wherein the control circuit is further configured to adjust a data clock earlier to an approximate edge position setting up to track an edge of the data eye responsive to initiating the calibration routine.

18. The system as recited in claim 15, wherein the control circuit is further configured to update only a data phase interpolator without updating an edge phase interpolator during the calibration routine.

19. The system as recited in claim 18, wherein the control circuit is configured to cause the first serial-to-parallel conversion circuit to output data using a first data path and the second serial-to-parallel conversion circuit to output data using a second data path different from the first data path without interrupting data capture.

20. The system as recited in claim 15, wherein the control circuit is configured to cause a secondary data capture unit to capture information from the first serial-to-parallel conversion circuit and a primary data capture unit to capture information from the second serial-to-parallel conversion circuit.

* * * * *